(12) United States Patent
Mitsui et al.

(10) Patent No.: US 11,925,307 B2
(45) Date of Patent: Mar. 12, 2024

(54) RECHARGEABLE CLEANER HAVING BODY CONTROLLER

(71) Applicant: MAKITA CORPORATION, Anjo (JP)

(72) Inventors: Ryuji Mitsui, Anjo (JP); Tadahiko Kobayakawa, Anjo (JP); Takuya Umemura, Anjo (JP); Toru Yamada, Anjo (JP); Mamoru Sakai, Anjo (JP)

(73) Assignee: MAKITA CORPORATION, Anjo (JP)

( * ) Notice: Subject to any disclaimer, the term of this patent is extended or adjusted under 35 U.S.C. 154(b) by 681 days.

(21) Appl. No.: 15/733,960

(22) PCT Filed: May 23, 2019

(86) PCT No.: PCT/JP2019/020520
§ 371 (c)(1),
(2) Date: Dec. 1, 2020

(87) PCT Pub. No.: WO2020/003828
PCT Pub. Date: Jan. 2, 2020

(65) Prior Publication Data
US 2021/0228040 A1 Jul. 29, 2021

(30) Foreign Application Priority Data
Jun. 26, 2018 (JP) .................. 2018-121289

(51) Int. Cl.
*H01M 10/46* (2006.01)
*A47L 5/24* (2006.01)
(Continued)

(52) U.S. Cl.
CPC .............. *A47L 9/2884* (2013.01); *A47L 5/24* (2013.01); *G01R 31/382* (2019.01);
(Continued)

(58) Field of Classification Search
CPC .. H02J 7/0063; H02J 7/000712; H02J 7/0071; H02J 7/007182; H02J 7/00045;
(Continued)

(56) References Cited

U.S. PATENT DOCUMENTS

2001/0017531 A1  8/2001  Sakakibara et al.
2003/0090239 A1  5/2003  Sakakibara
(Continued)

FOREIGN PATENT DOCUMENTS

CN      104682485 A    6/2015
CN      105078368 A   11/2015
(Continued)

OTHER PUBLICATIONS

Translation of KR20180038338A (Apr. 16, 2018) (Year: 2018).*
(Continued)

*Primary Examiner* — Edward Tso
(74) *Attorney, Agent, or Firm* — Oliff PLC

(57) ABSTRACT

A rechargeable cleaner includes a body, a rechargeable battery, a charger, and a body controller. The body is configured to generate suction power capable of sucking dust together with air using a motor. The rechargeable battery is configured to supply electric power to the motor. The charger is configured to charge the battery. The body controller is disposed in the body. The body controller controls at least one of a charging current and a charging voltage based on cell voltage information indicating a cell voltage, cell temperature information indicating a cell temperature, and battery identification information for identifying the battery that are acquired from the battery, and based on charger identification information for identifying the charger acquired from the charger.

20 Claims, 10 Drawing Sheets

(51) Int. Cl.
*A47L 9/28* (2006.01)
*G01R 31/382* (2019.01)
*H01M 10/44* (2006.01)
*H01M 10/48* (2006.01)
*H02J 7/00* (2006.01)

(52) U.S. Cl.
CPC ......... *H01M 10/443* (2013.01); *H01M 10/46* (2013.01); *H01M 10/48* (2013.01); *H01M 10/486* (2013.01); *H02J 7/0063* (2013.01); *H02J 7/00712* (2020.01)

(58) Field of Classification Search
CPC .. H01M 10/486; H01M 10/46; H01M 10/443; H01M 10/48; A47L 9/2884; A47L 5/24; A47L 9/2873; G01R 31/382
USPC ....... 320/107, 132, 134, 136, 150, 152, 160, 320/114
See application file for complete search history.

(56) References Cited

U.S. PATENT DOCUMENTS

| | | |
|---|---|---|
| 2015/0153416 A1 | 6/2015 | Umemura et al. |
| 2015/0320285 A1 | 11/2015 | Lee et al. |
| 2015/0372512 A1 | 12/2015 | Umemura et al. |

FOREIGN PATENT DOCUMENTS

| | | | |
|---|---|---|---|
| JP | 2001-238362 A | | 8/2001 |
| JP | 2003-324858 A | | 11/2003 |
| JP | 2004-158262 A | | 6/2004 |
| JP | 2008-278996 A | | 11/2008 |
| JP | 2009-238538 A | | 10/2009 |
| JP | 2014-172151 A | | 9/2014 |
| JP | 2016-10198 A | | 1/2016 |
| JP | 2016-152922 A | | 8/2016 |
| KR | 20180038338 A | * | 4/2018 |
| WO | 2001/80396 A1 | | 10/2001 |
| WO | 2014/119108 A1 | | 8/2014 |
| WO | 2017/002520 A1 | | 1/2017 |

OTHER PUBLICATIONS

Partial relevant translation of KR20180038338A (Apr. 16, 2018) (Year: 2018).*

Aug. 6, 2019 International Search Report issued in International Patent Application No. PCT/JP2019/020520.

Sep. 22, 2023 Office Action issued in Chinese Application No. 201980037144.5.

* cited by examiner

RECHARGEABLE CLEANER HAVING BODY CONTROLLER

FIELD

The present invention relates to a rechargeable cleaner.

BACKGROUND

Conventional rechargeable cleaners require several hours to charge a battery from a completely discharged state to a fully charged state. Widely known are techniques relating to a rechargeable cleaner that can be fully charged in a short time (refer to Patent Literature 1, for example). Patent Literature 1 uses a lithium-ion secondary battery that can be rapidly charged with an electric current at a rate of 10 C or more as a battery.

CITATION LIST

Patent Literature

Patent Literature 1: JP 2008-278996 A

SUMMARY

Technical Problem

When charging a battery at a charging rate of 10 C or higher, the current value of the charging current becomes ten times or larger the current value of the charging current at a current rate of 1 C. When the current value of the charging current becomes large, it is necessary to make an electric wire used as a charging path thicker than an ordinary electric wire, so that the rechargeable cleaner and a charger may possibly be increased in size and weight. In addition, when the current value of the charging current is large, the electronic parts may generate heat and have a high temperature at a time of rapid charging, thereby affecting the lives of various members. Alternatively, to efficiently radiate the heat generated, a larger radiator is required, so that the rechargeable cleaner and the charger may possibly be increased in size and weight. To address this, there is a demand for a rapidly rechargeable cleaner that is small in size and light in weight and that has a smaller effect on the lives of various members.

An object of an aspect of the present invention is to provide a rapidly rechargeable cleaner that is small in size and light in weight and that has a smaller effect on the lives of various members.

Solution to Problem

According to an aspect of the present invention, a rechargeable cleaner includes: a body configured to generate suction power capable of sucking dust together with air using a motor; a rechargeable battery configured to supply electric power to the motor; a charger configured to charge the battery; and a body controller disposed in the body, The body controller controls at least one of a charging current and a charging voltage based on cell voltage information indicating a cell voltage, cell temperature information indicating a cell temperature, and battery identification information for identifying the battery that are acquired from the battery, and based on charger identification information for identifying the charger acquired from the charger.

Advantageous Effects of Invention

An aspect of the present invention provides a rapidly rechargeable cleaner that is small in size and light in weight and that has a smaller effect on the lives of various members.

DESCRIPTION OF EMBODIMENTS

Embodiments according to the present invention will be described below in detail with reference to the accompanying drawings. The embodiments are not intended to limit the present invention. Components in the embodiments below include components replaceable and easy to replace by those skilled in the art and components substantially identical therewith. Furthermore, the components described below may be appropriately combined. If there are a plurality of embodiments, they may be combined.

In the following description, an X-axis direction is referred to as a "front-back direction". A Y-axis direction is referred to as a "left-right direction". The Y-axis direction is horizontally orthogonal to the X-axis direction. In the direction toward the "front" in the front-back direction, the left side is "left", and the right side is "right". A Z-axis direction is referred to as an "up-down direction". The Z-axis direction is orthogonal to the X-axis direction and the Y-axis direction.

First Embodiment

Figure 1:
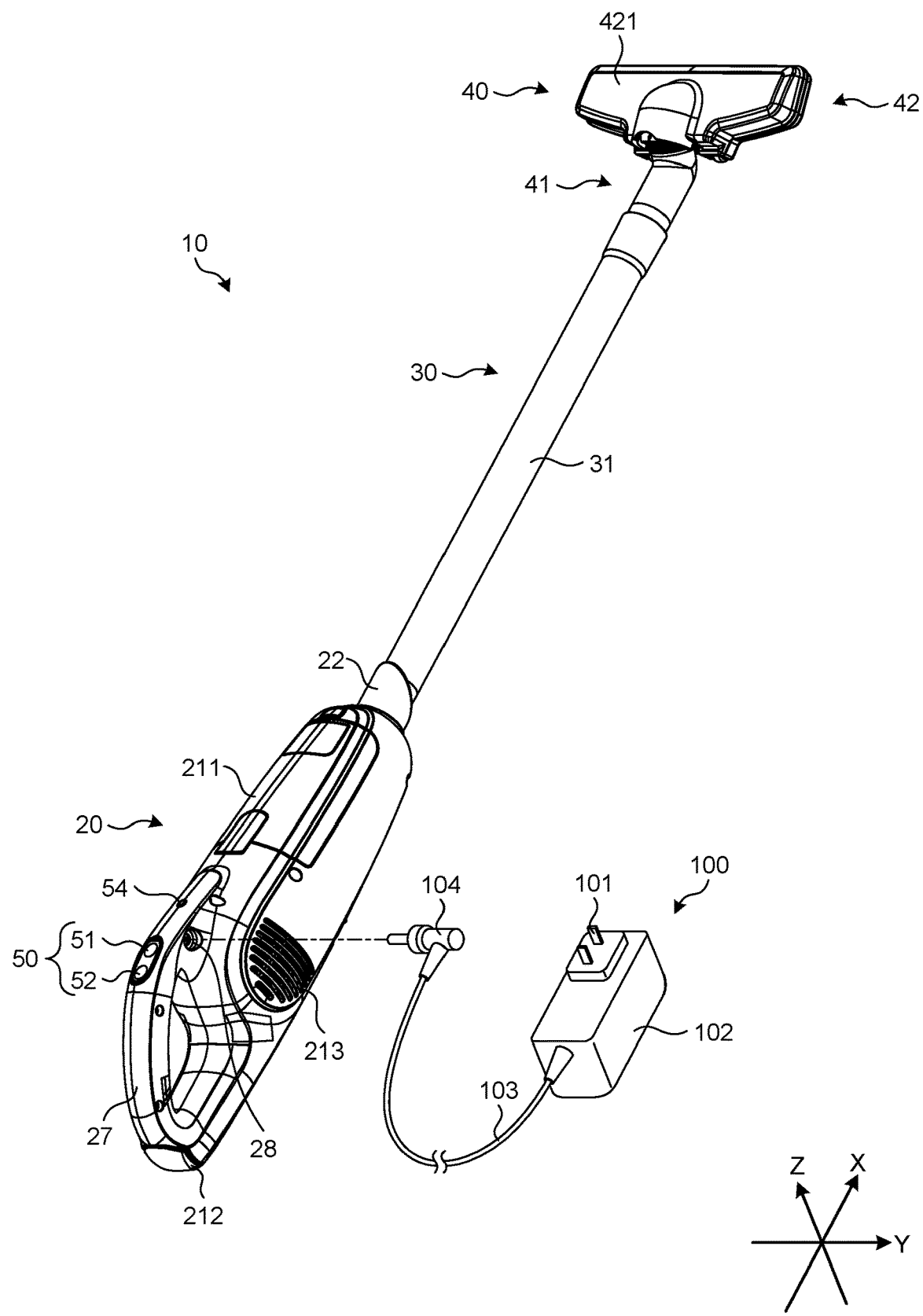
FIG. 1 is a perspective view of an example of a rechargeable cleaner according to a first embodiment.
Figure 2:
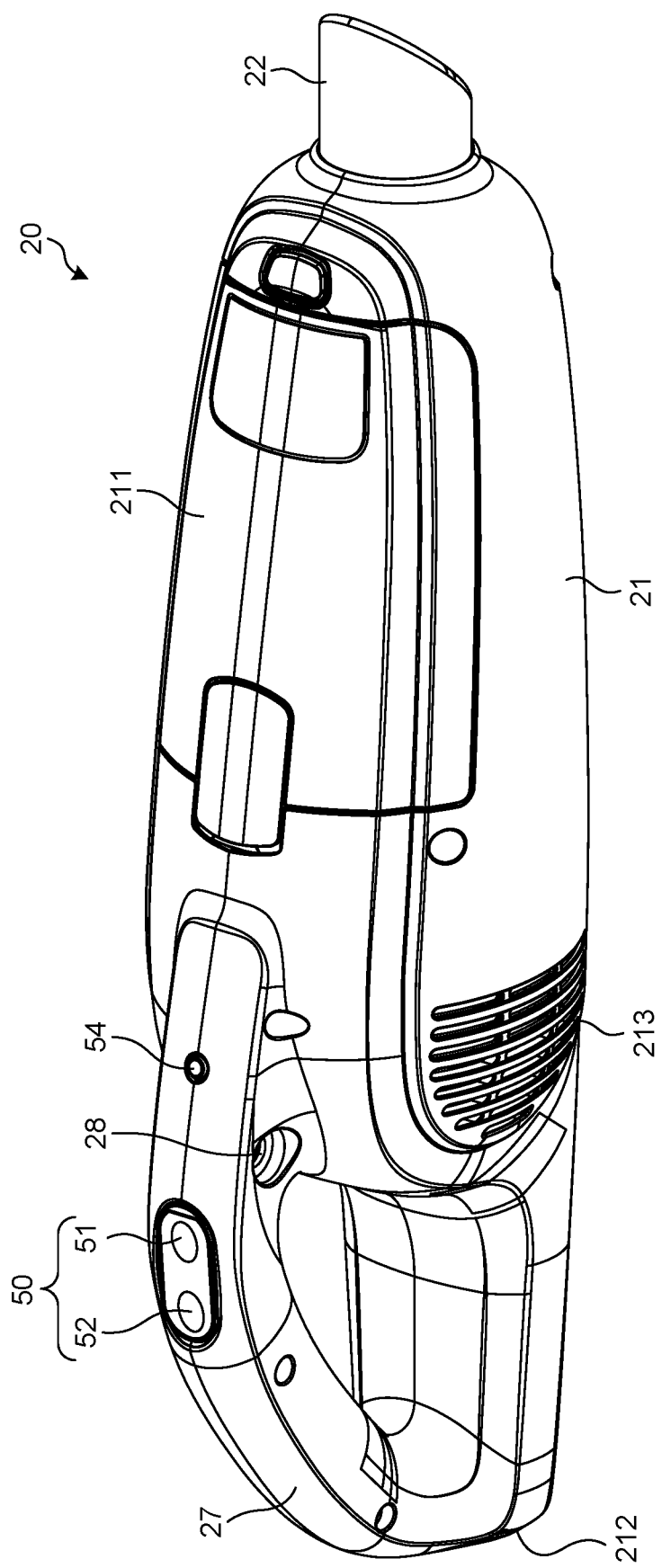
FIG. 2 is a perspective view of an example of a body of the rechargeable cleaner according to the first embodiment.
Figure 3:
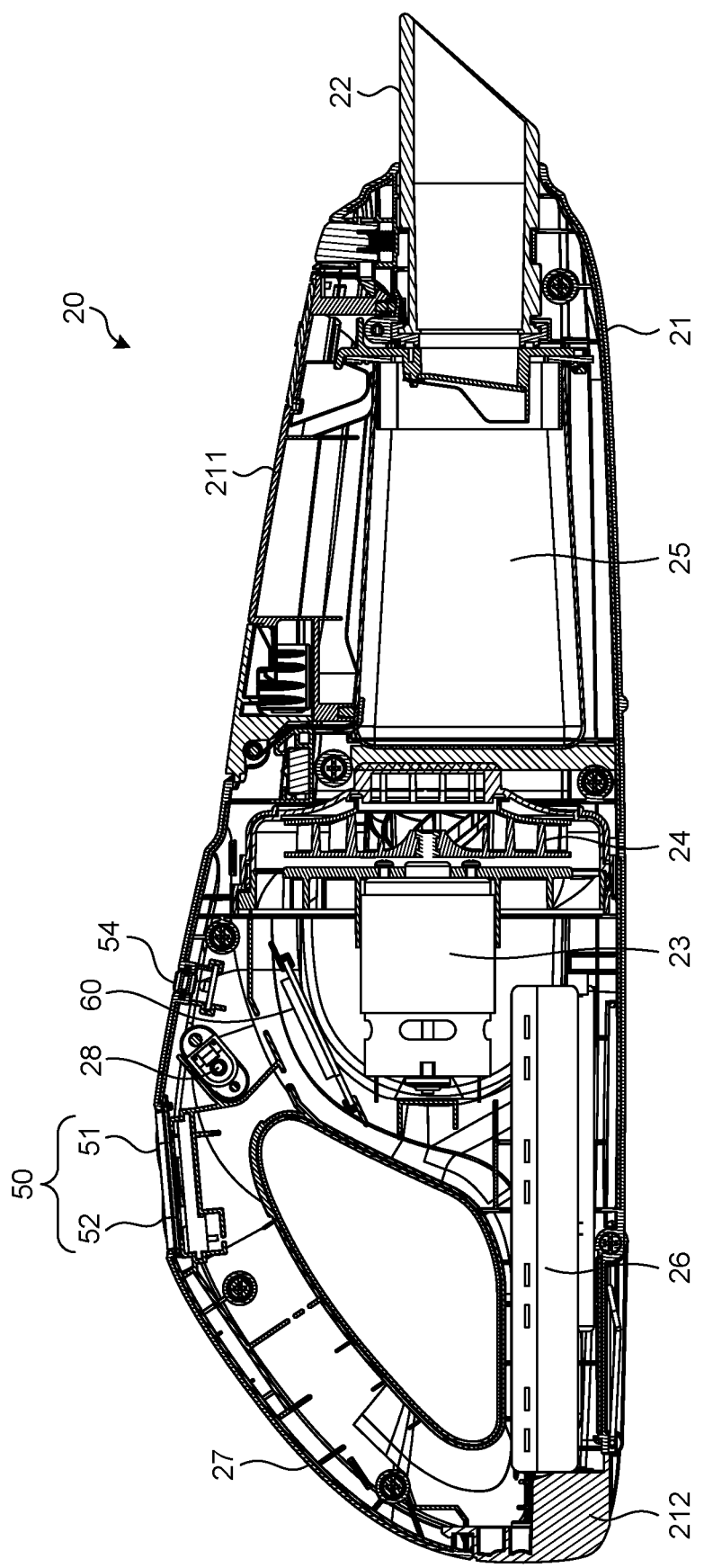
FIG. 3 is a sectional view of an example of the body of the rechargeable cleaner according to the first embodiment.
Figure 4:
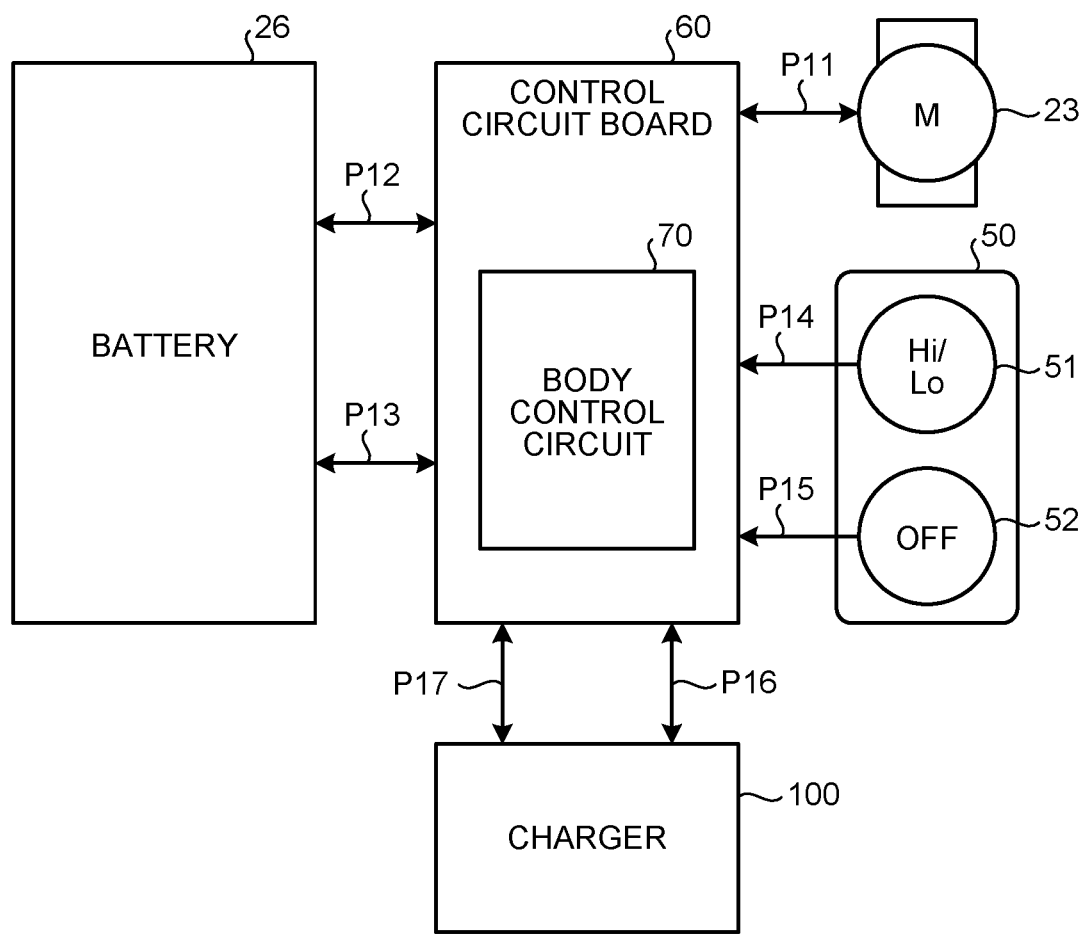
FIG. 4 is a block diagram of an example of a control circuit of the rechargeable cleaner according to the first embodiment.

An outline of a rechargeable cleaner 10 will be described with reference to FIGS. 1 to 4. FIG. 1 is a perspective view of an example of the rechargeable cleaner according to a first embodiment. FIG. 2 is a perspective view of an example of a body of the rechargeable cleaner according to the first embodiment. FIG. 3 is a sectional view of an example of the body of the rechargeable cleaner according to the first embodiment. FIG. 4 is a block diagram of an example of a control circuit of the rechargeable cleaner according to the first embodiment. The rechargeable cleaner 10 operates by being supplied with electric power from a rechargeable battery pack (hereinafter, referred to as a "battery") 26.

The rechargeable cleaner 10 includes a body unit (body) 20, a pipe unit 30, a nozzle unit 40, a control circuit board 60, and a charger 100.

The body unit 20 generates suction power capable of sucking dust together with air. The body unit 20 includes a case 21, a suction port 22, a motor 23, a suction fan 24, a dust collection filter 25, a battery 26, a handle 27, and a direct current (DC) jack 28.

The case 21 defines the outer shape of the body unit 20. The case 21 houses the motor 23, the suction fan 24, the dust collection filter 25, and the battery 26. The case 21 has a cylindrical shape. The case 21 includes an opening/closing cover 211, a lid 212, and an exhaust port 213.

The opening/closing cover 211 forms a part of the outer periphery of the case 21. The opening/closing cover 211 is disposed at the upper front part of the outer periphery of the case 21. The opening/closing cover 211 opens and closes with respect to the case 21. With the opening/closing cover 211 opened, the dust collection filter 25 can be taken in and out.

The lid 212 forms a part of the outer periphery of the case 21. The lid 212 opens and closes with respect to the case 21. With the lid 212 opened, the battery 26 can be taken in and out.

The exhaust port 213 communicates between the inside and the outside of the case 21. The exhaust port 213 discharges air sucked from the suction port 22 to the outside of the case 21.

The suction port 22 is a port through which dust is sucked into the dust collection filter 25 together with air. The suction port 22 communicates between the inside and the outside of the case 21. The suction port 22 is disposed at the front end of the case 21. To the suction port 22, the pipe unit 30 can be coupled. Through the suction port 22, external air is sucked into a housing 2 via the pipe unit 30 when the suction fan 24 rotates.

The motor 23 rotates, thereby rotating the suction fan 24 for generating suction power capable of sucking dust together with air. The motor 23 rotates by electric power supplied from the battery 26 via a discharging path P11 serving as an electric wire. The motor 23 is coupled to the suction fan 24 with an output shaft. In the case 21, the motor 23 is disposed behind the suction port 22, the suction fan 24, and the dust collection filter 25. The rotation speed of the motor 23 may be adjustable. The rotation speed of the motor 23 according to the present embodiment can be adjusted in three stages. The rotation speed of the motor 23 is controlled by a discharging current supplied from a body control circuit (body controller) 70 of the control circuit board 60.

The suction fan 24 generates suction power capable of sucking dust together with air when the motor 23 rotates. The suction fan 24 generates an air flow capable of sucking dust together with air. In the case 21, the suction fan 24 is disposed in front of the motor 23 and behind the dust collection filter 25. The suction fan 24 is coupled to a rotating shaft of the motor 23. The suction fan 24 rotates when the motor 23 rotates. When the suction fan 24 rotates, air is sucked into the case 21 from the suction port 22. The air flow volume of the suction fan 24 can be adjusted corresponding to the rotation speed of the motor 23. The airflow volume of the suction fan 24 according to the present embodiment can be adjusted in three stages. The airflow volume of the suction fan 24 varies depending on the operating mode of the rechargeable cleaner 10.

The dust collection filter 25 removes dust included in the sucked air. The dust collection filter 25 has a cylindrical shape with one end open and the other end closed. The dust collection filter 25 is housed in the case 21. More specifically, in the case 21, the dust collection filter 25 is disposed behind the suction port 22. In the case 21, the dust collection filter 25 is disposed in front of the suction fan 24. The opening of the dust collection filter 25 faces the suction port 22. The dust collection filter 25 causes air sucked from the suction port 22 to pass therethrough and collects dust included in the air inside thereof. The air passing through the dust collection filter 25 is discharged from the exhaust port 213. The dust collection filter 25 can be attached and detached with the opening/closing cover 211 opened.

The battery 26 is a rechargeable battery. The battery 26 is capable of being rapidly charged. The battery 26 can be charged at a charging rate of 3 C or higher and lower than 10 C. The battery 26 supplies electric power to the motor 23 of the rechargeable cleaner 10. The battery 26 is composed of a plurality of cells connected to each other. The capacity of the battery 26 according to the present embodiment is approximately 1 Ah or larger and 2 Ah or smaller. The battery 26 is attachable to and detachable from the inside of the case 21 with the lid 212 opened. The battery 26 is electrically connected to the body control circuit 70 of the control circuit board 60 via a signal path P12 serving as a signal line and a charging/recharging path P13 serving as an electric wire.

By setting the charging rate to 3 C or higher, the battery 26 is fully charged in 20 minutes or shorter. Approximately 20 minutes corresponds to the length of a typical break time, so that the battery 26 is charged while a user is having a break.

By setting the charging rate to lower than 10 C, power consumption is 0.1 W or larger and 0.4 W or smaller when the capacity of the battery 26 is 1 Ah or larger and 2 Ah or smaller, and on-resistance of an FET, which is not illustrated, disposed in the circuit is 1 Inn. The rechargeable cleaner 10 does not require any radiator plate because this level of power consumption generates a small amount of heat.

The battery 26 can detect at least one of a cell temperature and a cell voltage of the battery 26. The battery 26 according to the present embodiment detects the cell temperature and the cell voltage of the battery 26. The cell voltage of the battery 26 can be detected by a monitoring circuit, which is not illustrated. The cell temperature of the battery 26 can be detected by a temperature detecting circuit, which is not illustrated. The battery 26 outputs battery identification information for identifying the type of the battery 26 and battery information including at least one of the cell temperature and the cell voltage of the battery 26 as analog signals to the body control circuit 70 via the signal path P12. When the battery 26 is connected to the body unit 20, the battery 26 outputs the battery identification information and the battery information to the body control circuit 70. After charging is started, the battery 26 outputs the battery information to the body control circuit 70 at a predetermined timing.

The predetermined timing may be a timing of every certain time interval or a timing at which the cell voltage or the cell temperature changes by a predetermined threshold or larger.

Discharging of the battery 26 via the charging/discharging path P13 is controlled by the body control circuit 70. In discharging of the battery 26, the discharging current flows through the charging/discharging path P13 and the discharging path P11.

Charging of the battery 26 via a charging path P17 serving as an electric wire and the charging/discharging path P13 is controlled by the body control circuit 70. In charging of the battery 26, the charging current flows through the charging path P17 and the charging/discharging path P13.

The handle 27 is a grip that is gripped by the user.

The DC jack 28 can be electrically connected to a DC plug 104 of the charger 100. The DC jack 28 can be electrically connected to the battery 26 via the control circuit board 60. With this configuration, the DC jack 28 supplies a direct current for charging supplied from the charger 100 to the battery 26 via the control circuit board 60.

The pipe unit 30 allows air and dust sucked from the nozzle unit 40 to pass therethrough. The pipe unit 30 is attachable to and detachable from the suction port 22 and the nozzle unit 40. The pipe unit 30 connects the suction port 22 and the nozzle unit 40. The pipe unit 30 includes a pipe member 31. The pipe member 31 has a cylindrical shape. The front end of the pipe member 31 can be coupled to the nozzle unit 40. The back end of the pipe member 31 can be coupled to the suction port 22.

The nozzle unit 40 sucks air and dust. The nozzle unit 40 is attachable to and detachable from the front end of the pipe member 31 of the pipe unit 30. The nozzle unit 40 includes a coupler 41 and a head 42.

The coupler 41 can be coupled to the front end of the pipe member 31 of the pipe unit 30. The coupler 41 has a pipe shape. The coupler 41 has a bent shape in a side view. The head 42 is rotatably coupled to the distal end of the coupler 41.

The head 42 is a suction port through which air and dust are sucked. The head 42 includes a housing 421 and a suction port, which is not illustrated. The head 42 is coupled to the coupler 41 so as to be relatively rotatable in the circumferential direction of the pipe. The housing 421 has a box shape extending in the left-right direction. The housing 421 can house various members. The suction port is an opening formed on the bottom surface of the housing 421. The suction port communicates with the coupler 41.

An operating switch 50 is disposed on the handle 27. The operating switch 50 is an electronic switch that can receive various operations performed on the rechargeable cleaner 10. The operating switch 50 can be operated when the user grips the handle 27. The operating switch 50 includes a drive switch (mode setting operator) 51 and a stop switch 52.

The drive switch 51 is pressed and operated by the user to switch the operating mode indicating the strength of suction power of the rechargeable cleaner 10. In the present embodiment, every time the drive switch 51 is pressed, the operating mode can be switched between high (high mode), normal (low mode), and turbo (high-power mode). The high mode is a mode for rotating the motor 23 at high speed. The low mode is a mode for rotating the motor 23 at lower speed than the high mode. The high-power mode is a mode for rotating the motor 23 at higher speed than the high mode. Every time the drive switch 51 is pressed, the drive switch 51 outputs electrical signals corresponding to the operating information to the body control circuit 70 via a signal path P14 serving as a signal line.

The stop switch 52 is pressed and operated by the user to stop the operation of the rechargeable cleaner 10. If the stop switch 52 is pressed when the rechargeable cleaner 10 is operating, the stop switch 52 can stop the operation. When the stop switch 52 is pressed, the stop switch 52 outputs electrical signals corresponding to the operating information to the body control circuit 70 via a signal path P15 serving as a signal line.

An LED 54 is disposed in front of the operating switch 50. The LED 54 is turned on to indicate a charging state when the rechargeable cleaner 10 is being charged. The LED 54, for example, is turned on in red in rapid charging, turned on in orange in slow charging, and turned off when the rechargeable cleaner 10 is not being charged or is fully charged. The lighting state of the LED 54 is controlled by the body control circuit 70.

The control circuit board 60 is disposed in the case 21. The control circuit board 60 has a function of receiving electric power supplied from the charger 100 and charging the battery 26 and a function of receiving electric power supplied from the battery 26 and discharging it to the motor 23. In other words, the control circuit board 60 has a discharging path and a charging path. The discharging path is a path for flowing an electric current from the positive side of the battery 26 to the negative side of the battery 26 via the motor 23, that is, a path for discharging the battery 26. The charging path is a path that connects the positive terminal of the charger 100 to the positive side of the battery 26 and connects the negative terminal of the charger 100 to the negative side of the battery 26, that is, a path for charging the battery 26. The control circuit board 60 is provided with electronic parts that implement these functions. The control circuit board 60 includes the body control circuit 70.

The body control circuit 70 includes a central processing unit (CPU) that performs arithmetic processing and a memory that stores therein computer programs. The body control circuit 70 executes the rotation of the motor 23 and the charging and discharging of the battery 26 according to a control program stored in the memory.

The memory of the body control circuit 70 stores therein current values of the discharging current set for the respective operating modes as control data for rotating the motor 23 in the operating modes.

The memory of the body control circuit 70 stores therein information indicating specifications and charging capability of the charger for each charger type.

The memory of the body control circuit 70 stores therein, for each battery type, rated capacity, a range of allowable voltage in charging, a range of allowable temperature in charging, and a high-rate charging current for rapid charging, that is, the maximum allowable current as charging information. The memory of the body control circuit 70 also stores therein charging current characteristics and charging voltage characteristics as the charging information for each battery type.

Figure 5:
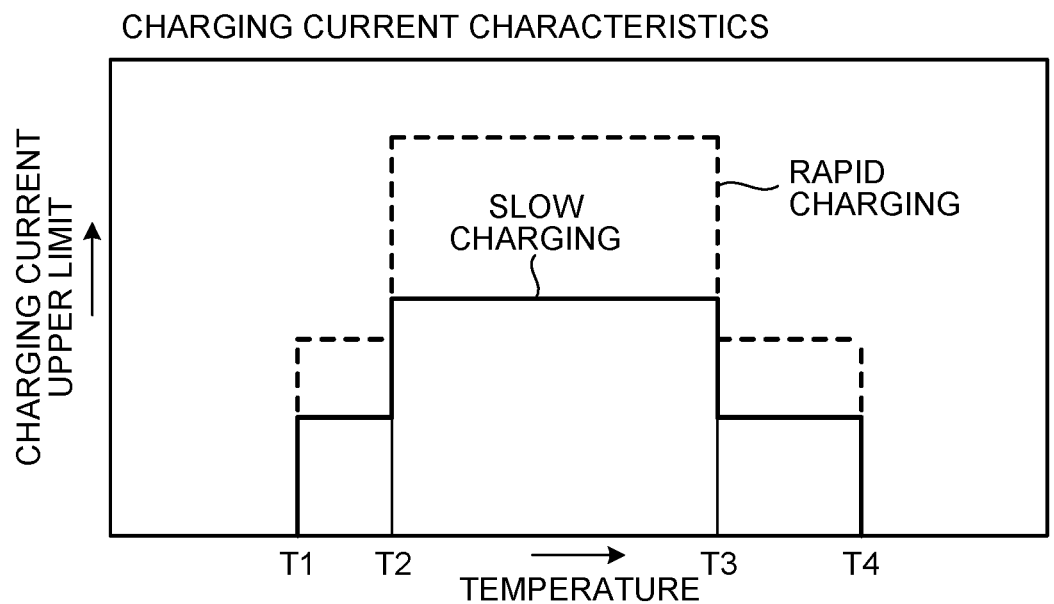
FIG. 5 is a diagram for explaining charging current characteristics.
Figure 6:
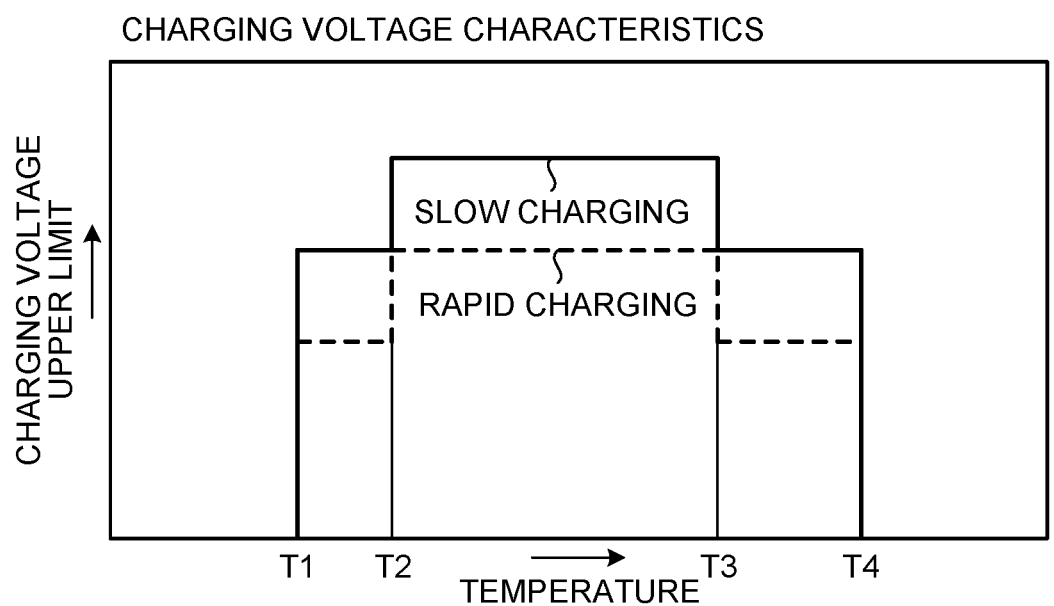
FIG. 6 is a diagram for explaining charging voltage characteristics.

The following describes the charging current characteristics and the charging voltage characteristics with reference to FIGS. 5 and 6. FIG. 5 is a diagram for explaining the charging current characteristics. FIG. 6 is a diagram for explaining the charging voltage characteristics. The charging current characteristics define the upper limit of the charging current corresponding to the cell temperature. The charging current characteristics define the characteristics of the high-rate charging current for rapid charging and the characteristics of the low-rate charging current for slow charging. The charging voltage characteristics define the upper limit of the charging voltage corresponding to the cell temperature. The charging voltage characteristics define the characteristics of the charging voltage for rapid charging and the characteristics of the charging voltage for slow charging.

The body control circuit 70 is electrically connected to the motor 23 via the discharging path P11. The body control circuit 70 is electrically connected to the battery 26 via the signal path P12 and the charging/discharging path P13. The body control circuit 70 is electrically connected to the drive switch 51 via the signal path P14. The body control circuit 70 is electrically connected to the stop switch 52 via the signal path P15. The body control circuit 70 is electrically connected to the charger 100 via a signal path P16 serving as a signal line and the charging path P17.

When the body control circuit 70 detects that the battery 26 is connected to the body unit 20, the body control circuit 70 acquires battery identification information and the battery information from the battery 26 via the signal path P12. At a predetermined timing after charging is started, the body control circuit 70 acquires battery information from the battery 26 via the signal path P12.

When the body control circuit 70 detects that the charger 100 is connected to the body unit 20, the body control circuit 70 acquires charger identification information from the charger 100 via the signal path P16.

The body control circuit 70 detects an output voltage between the terminal connected to the positive side of the battery 26 and the terminal connected to the negative side. The detected output voltage is the voltage of the battery 26, that is, the output voltage from the battery 26.

If the drive switch 51 is operated when the motor 23 is being stopped, the body control circuit 70 sets the operating mode to the high mode, for example, as an initial operating mode. The body control circuit 70 supplies the discharging current from the battery 26 to the motor 23 via the charging/discharging path P13 and the discharging path P11. After the initial operating mode is set, the body control circuit 70 switches the operating mode depending on whether the drive switch 51 is operated or on operating duration, that is, duration of the ON state until the stop switch 52 is operated. With this, the body control circuit 70 switches the discharging current from the battery 26.

Every time the drive switch 51 is operated when the motor 23 is operating, the body control circuit 70 controls the rotation speed of the motor 23 depending on the operating mode. When the drive switch 51 is operated to select the high mode, the body control circuit 70 performs control such that the rotation speed of the motor 23 is a high speed corresponding to the high mode. The body control circuit 70 increases the discharging current from the battery 26. When the drive switch 51 is operated to select the low mode, the body control circuit 70 performs control such that the rotation speed of the motor 23 is a normal speed corresponding to the low mode. The body control circuit 70 decreases the discharging current from the battery 26. When the drive switch 51 is operated to select the high-power mode, the body control circuit 70 performs control such that the rotation speed of the motor 23 is a high speed corresponding to the high-power mode. The body control circuit 70 makes the discharging current from the battery 26 larger than the discharging current in the high mode. With these operations, the amount of suction power of the rechargeable cleaner 10 is controlled in accordance with the operating modes.

If the stop switch 52 is operated when the motor 23 is rotating, the body control circuit 70 stops supply of the discharging current to stop the rotation of the motor 23.

The body control circuit 70 controls charging of the battery 26. After rapidly charging the battery 26, the body control circuit 70 slowly charges the battery 26. In charging, the body control circuit 70 adjusts at least one of the high-rate DC current and voltage output from the charger 100 to the charging current and the charging voltage that are required to charge the battery 26 based on the battery information, the battery identification information, and the charger identification information, and outputs them.

Rapid charging is charging with the charging current at a high rate of 3 C or higher and lower than 10 C. "C" is the unit indicating the charging/discharging rate (charge/discharge rate). 1 C indicates that charging can be achieved in one hour when constant-current charging is performed from a completely discharged state to a fully charged state. 3 C indicates that charging can be achieved in one-third hour, and 10 C indicates that charging can be achieved in one-tenth hour. At a charging/discharging rate of 3 C, the current value of the charging current is three times the current value at 1 C. At a charging/discharging rate of 10 C, the current value of the charging current is ten times the current value at 1 C.

In rapid charging, the body control circuit 70 outputs a charging current of approximately 3 A to 10 A when the capacity of the battery 26 is 1 Ah, for example, and outputs a charging current of approximately 6 A to 20 A when the capacity of the battery 26 is 2 Ah.

Slow charging is charging with the charging current at a lower rate than in rapid charging. Slow charging is charging with the charging current having a current value equal to or smaller than the current value of the charging current in rapid charging. When rapid charging is performed with a constant current of 10 A, for example, slow charging is performed at a current value of smaller than 10 A and a constant voltage.

The following describes charging control performed by the body control circuit 70 in more detail. When drive of the motor 23 is stopped, if the charger 100 is connected to the body unit 20, and the state of the battery 26 satisfies charging start conditions, the body control circuit 70 starts rapid charging of the battery 26. The body control circuit 70 acquires the current value of the high-rate charging current for rapid charging based on the charging information and the battery identification information. The body control circuit 70 causes an adjustment circuit (adjustment circuit unit) 71 to generate the high-rate charging current having the acquired current value and charges the battery 26.

The charging start conditions include that the cell temperature of the battery 26 is equal to or lower than a threshold for determining whether to start charging and that the cell voltage is equal to or lower than a threshold for determining whether to start charging. The charging start conditions are stored in the memory of the body control circuit 70 as the control data.

The charging start conditions may further include that the remaining charge of the battery 26 is smaller than a threshold for determining whether to start charging. More specifically, the charging start conditions may include that the output voltage from the battery 26 is lower than a threshold voltage for determining whether to start charging.

Figure 7:
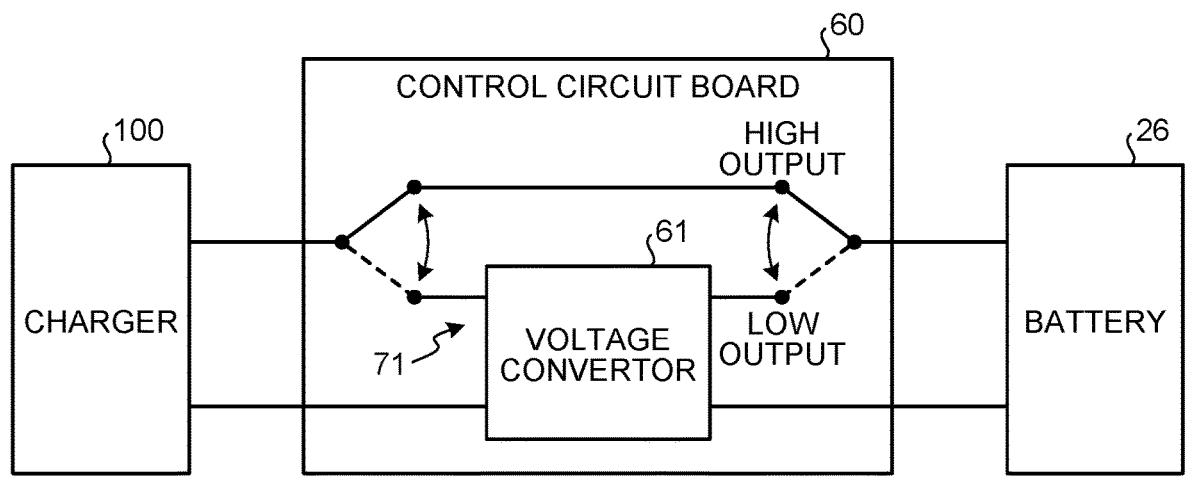
FIG. 7 is a block diagram of an example of an adjustment circuit that adjusts a charging current in the rechargeable cleaner according to the first embodiment.

The following describes the adjustment circuit 71 with reference FIG. 7. FIG. 7 is a block diagram of an example of the adjustment circuit 71 that adjusts the charging current in the rechargeable cleaner according to the first embodiment. The adjustment circuit 71 is disposed on the control circuit board 60. The adjustment circuit 71 adjusts at least one of high-output current and voltage output from the charger 100 to the charging current and the charging voltage required to charge the battery 26 and outputs them. The adjustment circuit 71 causes a voltage convertor 61 to convert the voltage into a low-output voltage as necessary and outputs the low-output voltage.

When rapid charging completion conditions are satisfied in rapid charging, the body control circuit 70 switches to slow charging.

The rapid charging completion conditions include that the cell voltage of the battery 26 falls within a predetermined range including the threshold voltage or that the cell temperature falls outside the range of allowable temperature. The rapid charging completion conditions are stored in the memory of the body control circuit 70 as the control data.

The rapid charging completion conditions may further include that the output voltage from the battery 26 is higher than a threshold voltage for determining whether to complete rapid charging.

When charging completion conditions are satisfied in slow charging, the body control circuit 70 stops charging.

The charging completion conditions include that the battery 26 is in the fully charged state. Determination as to whether the charging completion conditions are satisfied is based on at least one of the elapsed time from the start of charging, the charging capacity of the battery 26, and the cell voltage of the battery 26, for example. The charging completion conditions are stored in the memory of the body control circuit 70 as the control data.

To perform charging/discharging control, the body control circuit 70 monitors the output voltage from the battery 26 and various parameters, such as cell voltage, cell temperature, and whether disconnection occurs in the battery 26. When the parameters are in an abnormal state, the body control circuit 70 stops charging or discharging the battery 26. The body control circuit 70 appropriately adjusts the charging current and the charging voltage within a range where the current value and the voltage value do not exceed their respective upper limits based on the cell temperature, the charging current characteristics, and the charging voltage characteristics, and outputs them.

The body control circuit 70 can detect the temperature of the control circuit board 60 and an input voltage received from the charger 100. When the temperature of the control circuit board 60 is equal to or higher than a threshold, or when the input voltage is low, the body control circuit 70 restricts charging the battery 26.

In this way, charging control on the battery 26 is continuously performed by the body control circuit 70 until the battery 26 is fully charged. When the battery 26 is fully charged after starting charging of the battery 26, the body control circuit 70 stops supply of the charging current to finish charging of the battery 26.

The charger 100 generates and outputs a direct current for charging the battery 26 from an alternating current supplied from an AC power source. The charger 100 includes an attachment plug 101, an adapter case 102, an electric wire 103, and a DC plug 104. The attachment plug 101 can be inserted into an outlet of the AC power source. The adapter case 102 houses various electronic parts for generating a direct current. The various electronic parts housed in the adapter case 102 electrically connect the attachment plug 101 and the electric wire 103. The electric wire 103 electrically connects the attachment plug 101 and the DC plug 104. The DC plug 104 is disposed at the end of the electric wire 103. The DC plug 104 can be electrically connected to the DC jack 28 of the body unit 20. The DC plug 104 is inserted into the DC jack 28 of the body unit 20, thereby supplying the direct current generated in the charger 100 to the battery 26 via the control circuit board 60.

The charger 100 outputs the charger identification information for identifying the type of the charger 100 as analog signals to the body control circuit 70 via the signal path P16. When the charger 100 is connected to the body unit 20, the charger 100 outputs the charger identification information to the body control circuit 70.

Figure 8:
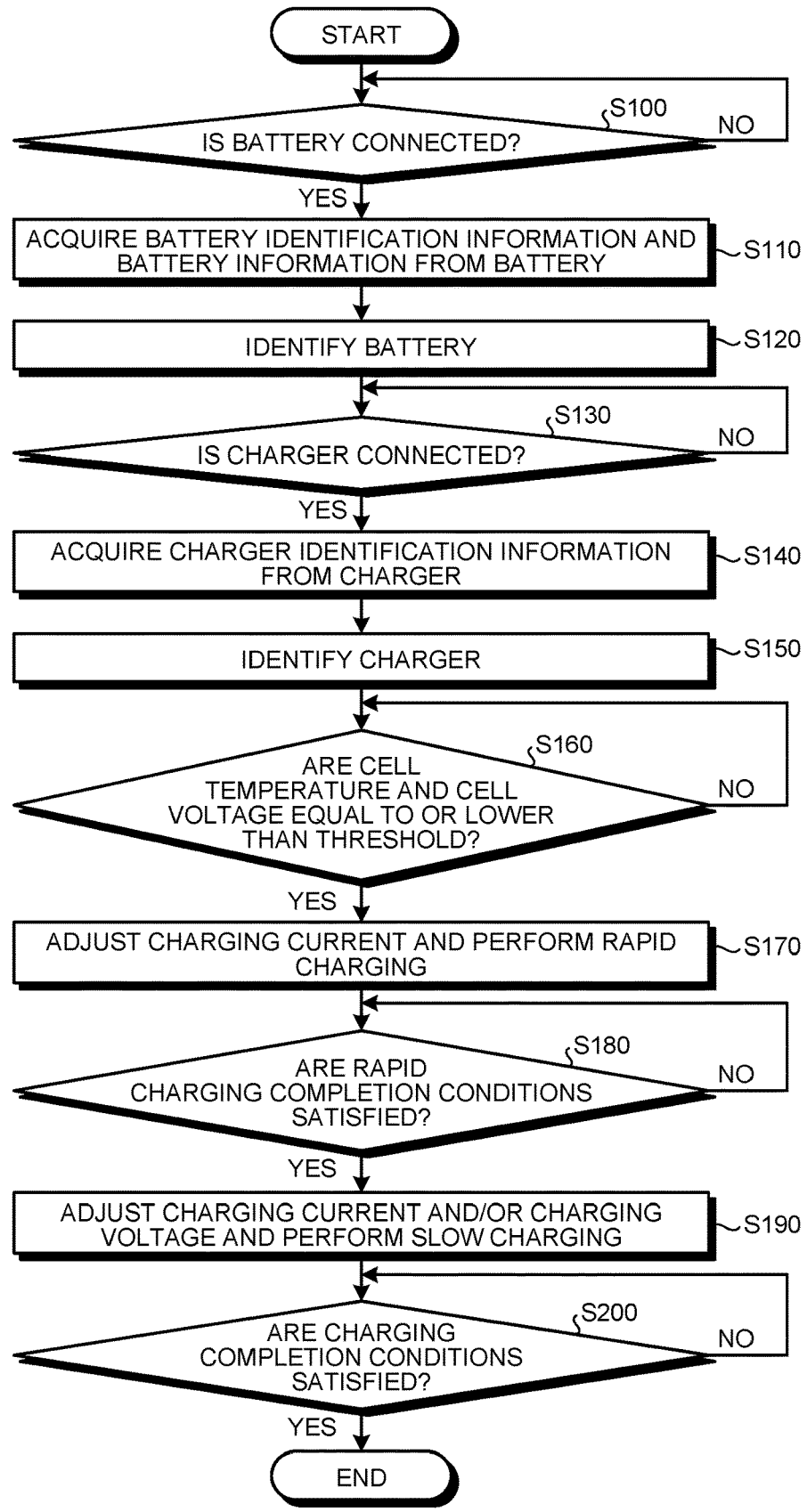
FIG. 8 is a flowchart of an example of a method for charging the rechargeable cleaner according to the first embodiment and illustrates processing performed by a body control circuit.

The following describes the method for charging the rechargeable cleaner 10 with reference to FIG. 8. FIG. 8 is a flowchart of an example of the method for charging the rechargeable cleaner according to the first embodiment and illustrates processing performed by the body control circuit.

The operations performed by the battery 26 of the rechargeable cleaner 10 in charging the battery 26 are described. When the battery 26 is connected to the body unit 20, the battery 26 outputs the battery identification information and the battery information to the body control circuit 70. After charging is started, the battery 26 outputs the battery information to the body control circuit 70 at a predetermined timing.

Next, the operations performed by the charger 100 to charge the battery 26 of the rechargeable cleaner 10 are described. When the charger 100 is connected to the body unit 20, the charger 100 outputs the charger identification information to the body control circuit 70.

The following describes the processing performed by the body control circuit 70 of the control circuit board 60 disposed in the body unit 20 to charge the battery 26 of the rechargeable cleaner 10.

The body control circuit 70 determines whether the battery 26 is connected to the body unit 20 (Step S100). If the body control circuit 70 determines that the battery 26 is connected (Yes at Step S100), the body control circuit 70 proceeds to Step S110. If the body control circuit 70 does not determine that the battery 26 is connected (No at Step S100), the body control circuit 70 performs the processing at Step S100 again.

The body control circuit 70 acquires the battery identification information and the battery information on the battery 26 from the battery 26 via the signal path P12 (Step S110).

After charging is started, the battery 26 outputs the battery information to the body control circuit 70 at a predetermined timing, and the body control circuit 70 acquires the battery information.

The body control circuit 70 identifies the battery 26 based on the battery identification information on the battery 26 (Step S120).

The body control circuit 70 determines whether the charger 100 is connected to the body unit 20 (Step S130). If the body control circuit 70 determines that the charger 100 is connected (Yes at Step S130), the body control circuit 70 proceeds to Step S140. If the DC plug 104 of the charger 100 is connected to the DC jack 28 of the body unit 20, the body control circuit 70 determines that the charger 100 is connected. If the body control circuit 70 does not determine that the charger 100 is connected (No at Step S130), the body control circuit 70 performs the processing at Step S130 again.

The body control circuit 70 acquires the charger identification information from the charger 100 (Step S140).

The body control circuit 70 identifies the charger 100 based on the charger identification information on the charger 100 (Step S150).

The body control circuit 70 determines whether the cell temperature and the cell voltage are equal to or lower than a threshold for starting charging as the charging start conditions based on the battery information (Step S160). If the body control circuit 70 determines that the cell temperature is equal to or lower than the threshold for starting charging and that the cell voltage is equal to or lower than the threshold for starting charging (Yes at Step S160), the body control circuit 70 proceeds to Step S170. If the body control circuit 70 determines that the cell temperature is larger than the threshold for starting charging or that the cell voltage is larger than the threshold for starting charging (No at Step S160), the body control circuit 70 performs the processing at Step S160 again.

At Step S160, the body control circuit 70 may also determine whether the remaining charge of the battery 26 is smaller than a threshold for determining whether to start charging as the charging start conditions.

The adjustment circuit 71 of the body control circuit 70 adjusts the charging current and performs rapid charging (Step S170). More specifically, the body control circuit 70 acquires the current value of the high-rate charging current for rapidly charging the battery 26 based on the charging information, the battery identification information, charger information, and the charger identification information. The body control circuit 70 may acquire the current value of the high-rate charging current for rapid charging based on the charging current characteristics and the charging voltage characteristics corresponding to the cell temperature stored in advance. The adjustment circuit 71 of the body control circuit 70 generates the high-rate charging current having the acquired current value. The body control circuit 70 outputs the generated high-rate charging current to the battery 26 via the charging/discharging path P13.

At Step S170, the body control circuit 70 always monitors whether the cell temperature falls within the range of allowable temperature for charging based on the battery information during rapid charging.

The body control circuit 70 determines whether the rapid charging completion conditions are satisfied based on the battery information (Step S180). The body control circuit 70 may determine whether the cell voltage of the battery 26 is equal to or lower than a threshold as the rapid charging completion conditions. If the output voltage from the battery 26 starts to rise during constant current charging in rapid charging, in other words, if the output voltage from the battery 26 reaches the threshold voltage, the body control circuit 70 switches to constant-voltage slow charging at a constant voltage. The body control circuit 70 may also determine whether the cell temperature falls within the range of allowable temperature as the rapid charging completion conditions. If the cell temperature rises to a high temperature during constant-current charging in rapid charging, the body control circuit 70 reduces the charging current and switches to constant-voltage slow charging at a constant voltage. In this case, the constant voltage may linearly or stepwisely change so as to be lower as the cell temperature is higher. If the body control circuit 70 determines that the rapid charging completion conditions are satisfied (Yes at Step S180), the body control circuit 70 proceeds to Step S190. If the body control circuit 70 does not determine that the rapid charging completion conditions are satisfied (No at Step S180), the body control circuit 70 performs the processing at Step S180 again.

At Step S180, the body control circuit 70 may also determine whether the output voltage from the battery 26 is higher than a threshold voltage for determining whether to complete rapid charging as the rapid charging completion conditions.

The adjustment circuit 71 of the body control circuit 70 adjusts the charging current and performs slow charging (Step S190). The body control circuit 70 always monitors the cell temperature and the cell voltage during slow charging. The body control circuit 70 may acquire the current value of the low-rate charging current based on the charging current characteristics and the charging voltage characteristics. If the cell temperature is equal to or higher than the upper limit threshold, the body control circuit 70 reduces the current value of the charging current. If the cell temperature is lower than the lower limit threshold, the body control circuit 70 stops slow charging. If the cell voltage is equal to or higher than the upper limit threshold, the body control circuit 70 reduces the current value of the charging current. If the cell voltage is abnormally higher than the upper limit threshold, the body control circuit 70 stops slow charging. The adjustment circuit 71 of the body control circuit 70 generates the charging current at a lower rate than the high rate of the calculated current value. The body control circuit 70 outputs the generated low-rate charging current to the battery 26 via the charging/discharging path P13.

The body control circuit 70 determines whether charging completion conditions are satisfied based on the battery information (Step S200). The body control circuit 70 determines whether the charging completion conditions are satisfied based on information on the charging capacity of the battery 26. The body control circuit 70 determines whether the charging completion conditions are satisfied based on at least one of the elapsed time from the start of charging, the charging capacity of the battery 26, and the cell voltage of the battery 26, for example. If the body control circuit 70 determines that the charging completion conditions are satisfied (Yes at Step S200), the body control circuit 70 ends the charging. If the body control circuit 70 does not determine that the charging completion conditions are satisfied (No at Step S200), the body control circuit 70 performs the processing at Step S200 again.

If the cell temperature falls significantly outside the range of allowable temperature or reaches a predetermined abnormal temperature at Step S180 or S200, the body control circuit 70 stops charging, which is not illustrated in the flowchart.

As described above, if the user connects the DC plug 104 of the charger 100 connected to an AC power source to the DC jack 28 of the body unit 20, and the charging start conditions are satisfied, the body control circuit 70 generates the high-rate charging current and rapidly charges the battery 26. Subsequently, if the rapid charging completion conditions are satisfied, the body control circuit 70 switches to slow charging. In slow charging, the body control circuit 70 generates the charging current at a lower rate than in the rapid charging to slowly charge the battery 26 until the battery 26 is fully charged. The battery 26 is fully charged in a short time.

As described above, the body control circuit 70 according to the present embodiment generates a high-rate charging current in rapid charging and generates a lower-rate charging current in slow charging than in rapid charging. The present embodiment can rapidly charge the battery 26 with the high-rate charging current. If the rapidly charging completion conditions are satisfied, the present embodiment can fully charge the battery 26 by slow charging with the low-rate charging current. Consequently, the present embodiment can fully charge the battery 26 in a short time.

The present embodiment rapidly charges the battery 26 with the charging current at a high rate of 3 C or higher and lower than 10 C. The present embodiment can use a thinner electric wire for the charging/discharging path than in a case where the charging current at a rate of 10 C or higher is used. Consequently, the present embodiment enables reduction in size and weight.

By setting the charging rate to 3 C or higher, the present embodiment can fully charge the battery 26 in 20 minutes or shorter. Consequently, the present embodiment can charge the battery 26 during a typical break time.

By setting the charging rate to lower than 10 C, the present embodiment can reduce power consumption to 0.1 W or larger and 0.4 W or smaller when the capacity of the battery 26 is 1 Ah or larger and 2 Ah or smaller, and on-resistance of the FET, which is not illustrated, disposed in the circuit is 1 mΩ. As described above, the present embodiment reduces power consumption and does not require any radiator plate. Consequently, the present embodiment enables reduction in size and weight.

Compared with a case where the charging current at a rate of 10 C or higher is used, the present embodiment can prevent heat generation. Consequently, the present embodiment has a smaller effect on the lives of various members.

The memory of the body control circuit 70 according to the present embodiment stores therein the charging information of each battery type and the charger information of each charger type. The present embodiment acquires the current value of the high-rate charging current for rapid charging based on the charging information, the battery identification information, the charger information, and the charger identification information. Consequently, the present embodiment can appropriately rapidly charge the battery 26 independently of the type of the battery 26 and the type of the charger 100.

Second Embodiment

Figure 9:
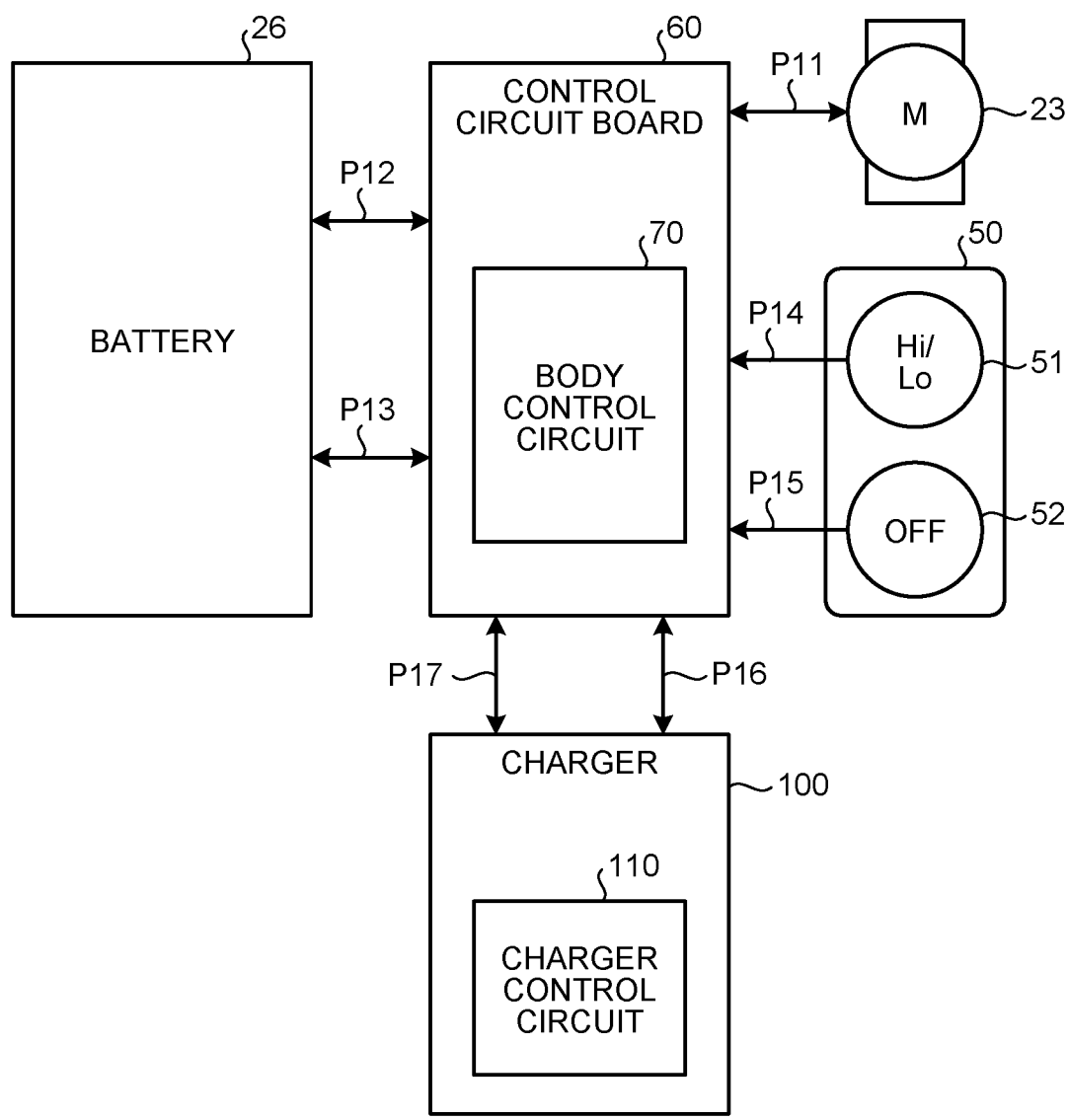
FIG. 9 is a block diagram of an example of the control circuit of the rechargeable cleaner according to a second embodiment.
Figure 10:
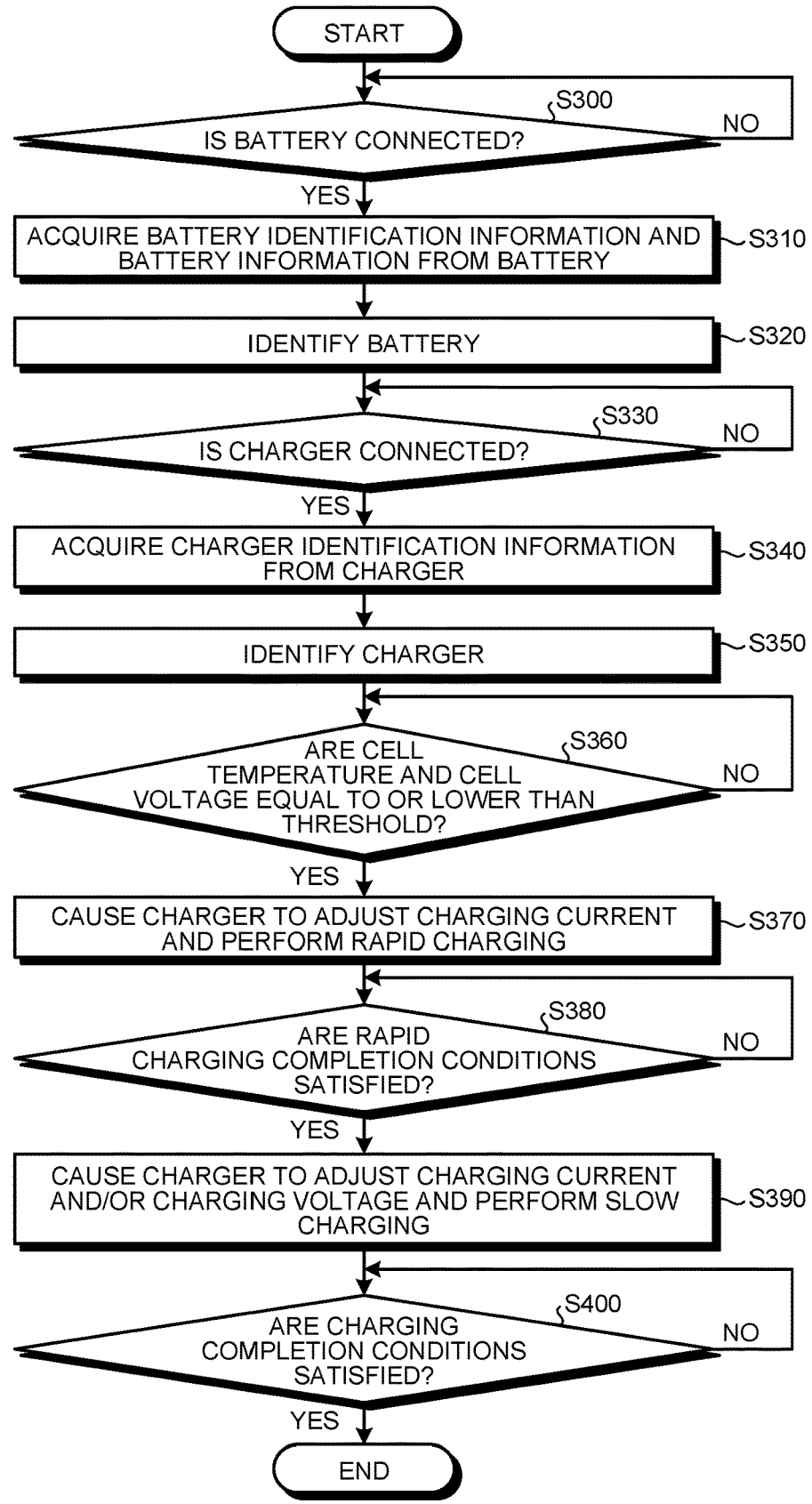
FIG. 10 is a flowchart of an example of the method for charging the rechargeable cleaner according to the second embodiment and illustrates processing performed by the body control circuit.
Figure 11:
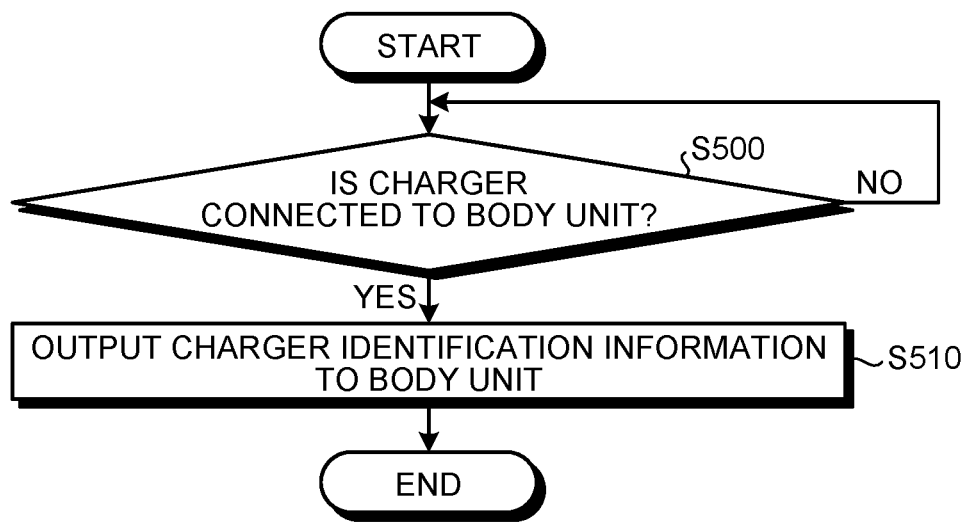
FIG. 11 is a flowchart of an example of the method for charging the rechargeable cleaner according to the second embodiment and illustrates processing performed by a charger control circuit.
Figure 12:
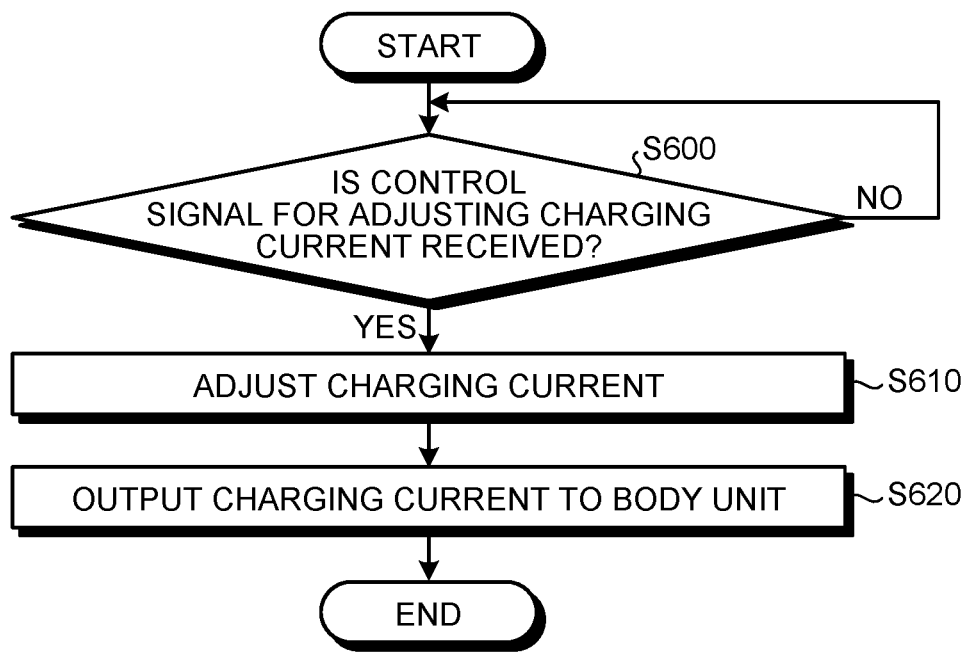
FIG. 12 is a flowchart of an example of the method for charging the rechargeable cleaner according to the second embodiment and illustrates processing performed by the charger control circuit.

The following describes the rechargeable cleaner 10 according to the present embodiment with reference to FIGS. 9 to 12. FIG. 9 is a block diagram of an example of the control circuit of the rechargeable cleaner according to the second embodiment. FIG. 10 is a flowchart of an example of the method for charging the rechargeable cleaner according to the second embodiment and illustrates processing performed by the body control circuit. FIG. 11 is a flowchart of an example of the method for charging the rechargeable cleaner according to the second embodiment and illustrates processing performed by a charger control circuit. FIG. 12 is a flowchart of an example of the method for charging the rechargeable cleaner according to the second embodiment and illustrates processing performed by the charger control circuit. The basic configuration of the rechargeable cleaner 10 is the same as that of the rechargeable cleaner 10 according to the first embodiment. In the following description, components similar to those of the rechargeable cleaner 10 are denoted by like or corresponding reference numerals, and detailed explanation thereof is omitted. The present embodiment is different from the first embodiment in that the body control circuit 70 does not include the adjustment circuit.

To charge the battery 26, the body control circuit 70 outputs current adjustment control signals to a charger control circuit (charger controller) 110 so as to cause the charger control circuit 110 to adjust at least one of the charging current and the charging voltage required to charge the battery 26 and output the charging current. The body control circuit 70 outputs the current adjustment control signals based on the cell temperature, the charging current characteristics, and the charging voltage characteristics, such that the current value and the voltage value are within ranges not exceeding the upper limit. The body control circuit 70 according to the present embodiment does not include the adjustment circuit.

The current adjustment control signal includes at least one of the current value of the charging current and the voltage value of the charging voltage to be generated in and output from the charger 100.

The charger 100 includes the attachment plug 101, the adapter case 102, the electric wire 103, the DC plug 104, and the charger control circuit 110.

The charger control circuit 110 includes a CPU that performs arithmetic processing and a memory that stores therein computer programs. The charger control circuit 110 adjusts at least one of the current value of the charging current and the voltage value of the charging voltage based on the current adjustment control signals received from the body control circuit 70 and outputs the them.

The following describes the method for charging the rechargeable cleaner 10 with reference to FIGS. 10 to 12.

First, the processing performed by the body control circuit 70 of the control circuit board 60 to charge the battery 26 of the rechargeable cleaner 10 is described with reference to FIG. 10. The processing at Steps S300 to S360, S380, and S400 is the same as the processing at Steps S100 to S160, S180, and S200 in the flowchart illustrated in FIG. 8.

The body control circuit 70 causes the charger 100 to adjust the charging current and performs rapid charging (Step S370). More specifically, the body control circuit 70 acquires the current value of the high-rate charging current for rapidly charging the battery 26 based on the charging information, the battery identification information, the charger information, and the charger identification information. The body control circuit 70 may acquire the current value of the high-rate charging current for rapid charging based on the charging current characteristics and the charging voltage characteristics corresponding to the cell temperature stored in advance. The body control circuit 70 outputs the current adjustment control signals to the charger 100 so as to cause the charger 100 to generate the high-rate charging current having the acquired current value. The body control circuit 70 outputs the high-rate charging current generated by the charger 100 to the battery 26 via the charging/discharging path P13.

The body control circuit 70 causes the charger 100 to adjust the charging current and performs slow charging (Step S390). The body control circuit 70 may acquire the current value of the low-rate charging current based on the charging current characteristics and the charging voltage characteristics. The body control circuit 70 outputs the current adjustment control signals to the charger 100 so as to cause the charger 100 to generate the charging current at a lower rate than the high-rate of the calculated current value. The body control circuit 70 outputs the low-rate charging current generated by the charger 100 to the battery 26 via the charging/discharging path P13.

The following describes the processing performed by the charger control circuit 110 of the charger 100 to charge the battery 26 of the rechargeable cleaner 10 with reference to FIG. 11.

The charger control circuit 110 determines whether the charger 100 is connected to the body unit 20 (Step S500). If the charger control circuit 110 determines that the charger 100 is connected (Yes at Step S500), the charger control circuit 110 proceeds to at Step S510. If the DC plug 104 of the charger 100 is connected to the DC jack 28 of the body unit 20, the charger control circuit 110 determines that the charger 100 is connected to the body unit 20. If the charger control circuit 110 does not determine that the charger 100 is connected to the body unit 20 (No at Step S500), the charger control circuit 110 performs the processing at Step S500 again.

The charger control circuit 110 outputs the charger identification information on the charger 100 to the body control circuit 70 via the signal path P12 (Step S510).

The following describes the processing performed by the charger control circuit 110 of the charger 100 to charge the battery 26 of the rechargeable cleaner 10 with reference to FIG. 12.

The charger control circuit 110 determines whether it has received the current adjustment control signals for adjusting the charging current from the body control circuit 70 (Step S600). If the charger control circuit 110 determines that it has received the current adjustment control signals (Yes at Step S600), the charger control circuit 110 proceeds to Step S610. If the charger control circuit 110 does not determine that it has received the current adjustment control signals (No at Step S600), the charger control circuit 110 performs the processing at Step S600 again.

The charger control circuit 110 adjusts the charging current based on the current adjustment control signals (Step S610).

The charger control circuit 110 outputs the adjusted charging current to the body control circuit 70 (Step S620).

The body control circuit 70 according to the present embodiment causes the charger 100 to generate and output a high-rate charging current in rapid charging and generate and output a lower-rate charging current in slow charging than in rapid charging. The present embodiment can rapidly charge the battery 26 with the high-rate charging current.

The charger 100 according to the present invention adjusts the electric current, and the control circuit board 60 is not provided with any electronic parts that control the charging current and the charging voltage. The present embodiment enables reduction in size and weight. Consequently, the present embodiment can reduce load on the user in use of the rechargeable cleaner 10.

The charger 100 according to the present embodiment adjusts the electric current, and the control circuit board 60 is not provided with any electronic parts that control the charging current and the charging voltage. The present embodiment can reduce the number of electronic parts that generate heat in the body unit 20. The present embodiment can prolong the lives of various members disposed in the body unit 20.

The electric wire 103 of the charger 100 may be detachable from the adapter case 102. With this configuration, the electric wire 103 is easy to replace when it is broken. Furthermore, the electric wire 103 can be replaced by another electric wire 103 having an appropriate length depending on the place of use of the charger 100, for example.

The body unit 20 may be provided with a USB terminal through which electric power can be supplied from the battery 26 to external electronic devices. With this configuration, the rechargeable cleaner 10 can supply electric power to a mobile electronic device of the user when supply from the AC power source stops in disasters, for example.

The battery 26 may be capable of detecting the voltage of the battery 26. The voltage of the battery 26 can be detected by a monitoring circuit, which is not illustrated, disposed in the battery 26. If the monitoring circuit detects that the voltage of the battery 26 exceeds a threshold, the monitoring circuit can output detection information as digital signals to the body control circuit 70. The body control circuit 70 can acquire the voltage detected by the battery 26. The body control circuit 70 compares the voltage detected by the battery 26 with the voltage of the battery 26 detected by the body control circuit 70, thereby enabling calculating a drop in voltage in the charging/discharging path P13. As a result, erroneous recognition of the voltage of the battery 26 is prevented. Consequently, charging can be more appropriately controlled.

In the embodiments described above, the battery 26 and the body control circuit 70 are electrically connected via the signal path P12 serving as a signal line and the charging/discharging path P13 serving as an electric wire. Alternatively, the electric wire may function not only as the charging/discharging path P13 but also as the signal path P12. For example, the electric wire may function as the signal path P12 when charging or discharging is stopped by a switch. Information may be transmitted and received using an inductance component in the cell, for example.

The configuration of the rechargeable cleaner 10 described above is given by way of example only. The combination and the shapes of the body unit 20, the pipe unit 30, and the nozzle unit 40 are not limited to those described above. The battery 26 may be detachably or non-detachably incorporated inside or outside the case 21.

REFERENCE SIGNS LIST 10 rechargeable cleaner
20 body unit (body)
21 case
22 suction port
23 motor
24 suction fan
25 dust collection filter
26 battery
27 handle
28 DC jack
30 pipe unit
31 pipe member
40 nozzle unit
41 coupler
42 head
50 operating switch
51 drive switch
52 stop switch
54 LED
60 control circuit board
70 body control circuit (body controller)
100 charger
110 charger control circuit (charger controller)

The invention claimed is:

1. A rechargeable cleaner comprising:
a body configured to generate suction power capable of sucking dust together with air using a motor;
a rechargeable battery configured to supply electric power to the motor;
a charger configured to charge the battery; and
a body controller disposed in the body, wherein
the body controller is configured to adjust at least one of a current and a voltage output from the charger to be suitable for charging the battery based on cell voltage information indicating a cell voltage, cell temperature information indicating a cell temperature, and battery identification information for identifying the battery that are acquired from the battery, and based on charger identification information for identifying the charger acquired from the charger, so as to output electric power having a charging current and a charging voltage suitable for charging the battery.

2. The rechargeable cleaner according to claim 1, wherein the battery is capable of being charged at a charging rate of 3 C or higher and lower than 10 C.

3. The rechargeable cleaner according to claim 2, wherein the body controller adjusts both the current and the voltage output from the charger.

4. The rechargeable cleaner according to claim 1, wherein the body controller adjusts both the current and the voltage output from the charger.

5. The rechargeable cleaner according to claim 1, wherein the body controller switches between rapid charging and slow charging with a charging current at a lower rate than in the rapid charging.

6. The rechargeable cleaner according to claim 5, wherein the rapid charging is charging with a charging current at a rate of 3 C or higher and lower than 10 C.

7. The rechargeable cleaner according to claim 5, wherein the body controller starts the rapid charging when the cell temperature of the battery is equal to or lower than a threshold for starting charging and the cell voltage is equal to or lower than a threshold for starting charging.

8. The rechargeable cleaner according to claim 7, wherein the body controller switches to the slow charging when an output voltage from the battery reaches a threshold voltage.

9. The rechargeable cleaner according to claim 8, wherein the body controller switches to the slow charging when the cell temperature falls outside a predetermined range.

10. The rechargeable cleaner according to claim 7, wherein the body controller switches to the slow charging when the cell temperature falls outside a predetermined range.

11. A rechargeable cleaner comprising:
a body configured to generate suction power capable of sucking dust together with air using a motor;
a rechargeable battery configured to supply electric power to the motor;
a charger configured to charge the battery;
a body controller disposed in the body; and
a charger controller disposed in the charger, wherein
the body controller is configured to
acquire at least one of a current value and a voltage value suitable for charging the battery based on cell voltage information indicating a cell voltage, cell temperature information indicating a cell temperature, and battery identification information for identifying the battery that are acquired from the battery, and based on charger identification information for identifying the charger acquired from the charger, and
output, to the charger controller, a control signal that includes the at least one of the current value and the voltage value thus acquired,
the charger controller is configured to generate electric power having a charging current and a charging voltage suitable for charging the battery by adjusting at least one of the charging current and the charging voltage in accordance with the at least one of the current value and the voltage value included in the control signal, and to output the electric power.

12. The rechargeable cleaner according to claim 11, wherein the body controller acquires both the current value and the voltage value and outputs, to the charger, the control signal including both the current value and the voltage value.

13. The rechargeable cleaner according to claim 11, wherein the battery is capable of being charged at a charging rate of 3 C or higher and lower than 10 C.

14. The rechargeable cleaner according to claim 11, wherein the body controller switches between rapid charging and slow charging with a charging current at a lower rate than in the rapid charging.

15. The rechargeable cleaner according to claim 14, wherein the rapid charging is charging with a charging current at a rate of 3 C or higher and lower than 10 C.

16. The rechargeable cleaner according to claim 14, wherein the body controller starts the rapid charging when the cell temperature of the battery is equal to or lower than a threshold for starting charging and the cell voltage is equal to or lower than a threshold for starting charging.

17. The rechargeable cleaner according to claim 16, wherein the body controller switches to the slow charging when the cell temperature falls outside a predetermined range.

18. The rechargeable cleaner according to claim 16, wherein the body controller switches to the slow charging when an output voltage from the battery reaches a threshold voltage.

19. The rechargeable cleaner according to claim 18, wherein the body controller switches to the slow charging when the cell temperature falls outside a predetermined range.

20. A rechargeable cleaner comprising:
a body configured to generate suction power capable of sucking dust together with air using a motor;
a rechargeable battery disposed inside the body and configured to supply electric power to the motor;
a charger disposed outside the body and configured to be electrically connected to the body and to charge the battery; and
a body controller disposed in the body, wherein
the body controller is configured to acquire, from the charger, charger identification information for identifying the charger and to control at least one of a charging current and a charging voltage based on cell voltage information indicating a cell voltage, cell temperature information indicating a cell temperature, and battery identification information for identifying the battery that are acquired from the battery, and based on the charger identification information.

* * * * *